US012685231B2

(12) United States Patent
Do et al.

(10) Patent No.: US 12,685,231 B2
(45) Date of Patent: Jul. 14, 2026

(54) STACK PACKAGES

(71) Applicant: SK hynix Inc., Icheon-si (KR)

(72) Inventors: Eun Hye Do, Icheon-si (KR); Chang Shik Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 375 days.

(21) Appl. No.: 18/483,298

(22) Filed: Oct. 9, 2023

(65) Prior Publication Data

US 2024/0339436 A1     Oct. 10, 2024

(30) Foreign Application Priority Data

Apr. 4, 2023     (KR) ........................ 10-2023-0044412

(51) Int. Cl.
| | |
|---|---|
| *H10W 90/00* | (2026.01) |
| *H10B 80/00* | (2023.01) |
| *H10W 72/30* | (2026.01) |
| *H10W 72/50* | (2026.01) |
| *H10W 72/00* | (2026.01) |
| *H10W 90/24* | (2026.01) |

(52) U.S. Cl.
CPC ............ *H10W 90/00* (2026.01); *H10B 80/00* (2023.02); *H10W 72/07554* (2026.01); *H10W 90/24* (2026.01); *H10W 90/732* (2026.01); *H10W 90/734* (2026.01); *H10W 90/752* (2026.01); *H10W 90/754* (2026.01)

(58) Field of Classification Search
CPC ..... H01L 25/0657; H01L 24/48; H01L 24/32; H01L 2224/32145; H01L 2224/48105; H01L 2224/48227; H01L 2225/06506; H01L 2225/0651; H01L 2225/06562; H01L 24/49; H01L 23/4824; H10B 80/00; H10W 90/00; H10W 72/07554; H10W 90/24; H10W 90/732; H10W 90/752; H10W 90/754; H10W 72/50; H10W 20/484; H10W 72/30
See application file for complete search history.

(56) References Cited

U.S. PATENT DOCUMENTS

| | | | |
|---|---|---|---|
| 11,462,511 B2 | 10/2022 | Eom et al. | |
| 2020/0343221 A1* | 10/2020 | Pon ........................ | H01L 21/561 |
| 2023/0005884 A1* | 1/2023 | Park ....................... | H10W 90/00 |
| 2023/0069208 A1* | 3/2023 | Lee ........................ | H10W 90/00 |
| 2023/0178518 A1* | 6/2023 | Do ......................... | H01L 24/48 |
| 2025/0070088 A1* | 2/2025 | Hong .................... | H10W 72/90 |

FOREIGN PATENT DOCUMENTS

| | | |
|---|---|---|
| KR | 100886717 B1 | 3/2009 |

* cited by examiner

*Primary Examiner* — David Vu
*Assistant Examiner* — Brandon C Fox
(74) *Attorney, Agent, or Firm* — WILLIAM AND ASSOCIATES LTD.

(57)     ABSTRACT

A stack package is provided. The stack package includes a package substrate on which a first bond finger and a second bond finger are spaced apart from each other, and a second semiconductor die stacked over a first semiconductor die. A first connector connects the first semiconductor die to the first bond finger. A second connector connects the second semiconductor die to the second bond finger and extends to have substantially the same length as the first connector.

18 Claims, 3 Drawing Sheets

STACK PACKAGES

CROSS-REFERENCE TO RELATED APPLICATIONS

The present application claims priority under 35 U.S.C. 119(a) to Korean Application No. 10-2023-0044412, filed on Apr. 4, 2023, in the Korean Intellectual Property Office, which is incorporated herein by reference in its entirety.

BACKGROUND

1. Technical Field

The present disclosure generally relates to a packaging technology and, more particularly, to stack packages in which semiconductor dies are stacked.

2. Related Art

Recently, as electronic products become smaller and more powerful, and the demand for portable mobile products increases, semiconductor package products with large capacity, low power consumption, or high-speed operation are required. A high bandwidth package product including a plurality of signal transmission channels is required for various electronic products. Attempts are being made to embed a greater number of semiconductor dies within a semiconductor package. Various types of stack package structures in which a plurality of semiconductor dies are stacked have been attempted. Bonding wires may signally and electrically connect the stacked semiconductor dies to a package substrate.

SUMMARY

According to an embodiment, a semiconductor package may include a package substrate on which a first bond finger and a second bond finger are spaced apart from each other, a first semiconductor die disposed over a portion of the package substrate between the first bond finger and the second bond finger, a second semiconductor die stacked over the first semiconductor die, a first connector connecting the first semiconductor die to the first bond finger, and a second connector connecting the second semiconductor die to the second bond finger and extending to have a length substantially the same as that of the first connector.

According to another embodiment, a semiconductor package may include a package substrate on which a first bond finger and a second bond finger are spaced apart from each other, a first semiconductor die disposed over a portion of the package substrate between the first bond finger and the second bond finger, a second semiconductor die stacked over the first semiconductor die, a first connector connecting the first semiconductor die to the first bond finger, and a second connector connecting the second semiconductor die to the second bond finger. A second distance in which the second bond finger is spaced apart from a position where a second side surface of the second semiconductor die adjacent to the second bond finger overlaps with the package substrate is shorter than a first distance in which the first bond finger is spaced apart from a first side surface of the first semiconductor die.

BRIEF DESCRIPTION OF THE DRAWINGS

FIG. 2 is an enlarged view of some portions of the stack package of FIG. 1.

FIG. 3 is a view illustrating a stack package according to an embodiment of the present disclosure.

DETAILED DESCRIPTION

Figure 1:
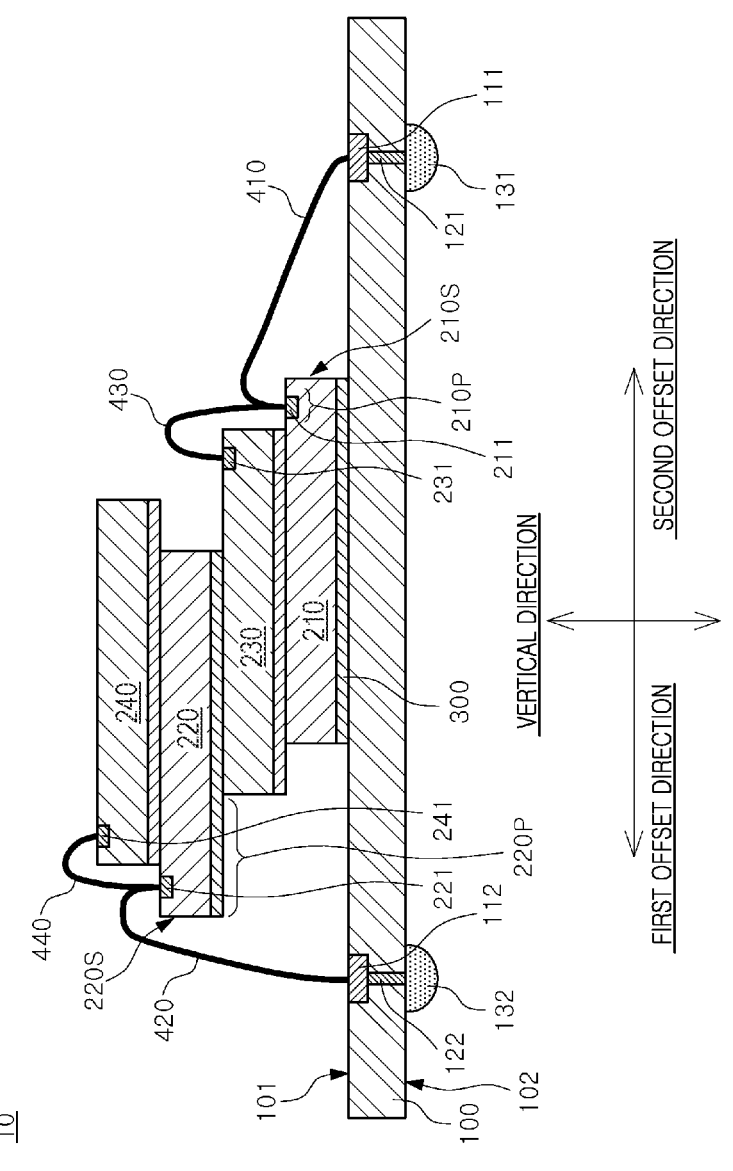
FIG. 1 is a view illustrating a stack package according to an embodiment of the present disclosure.

The terms used herein may correspond to words selected in consideration of their functions in presented embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

In the description of the present disclosure, descriptions such as "first" and "second," "bottom," "top," and "lower" are for distinguishing elements, and are not used to limit the elements themselves or to imply a specific order. It will be understood that when an element or layer etc., is referred to as being "on," "connected to" or "coupled to" another element or layer etc., it can be directly on, connected or coupled to the other element or layer etc., or intervening elements or layers etc., may be present. In contrast, when an element or layer etc., is referred to as being "directly on," "directly connected to" or "directly coupled to" another element or layer etc., there are no intervening elements or layers etc., present.

A semiconductor package may include a semiconductor die (or a semiconductor chip). The semiconductor package may include a structure in which a plurality of semiconductor dies are stacked. The semiconductor die may include integrated circuits. The semiconductor die may be separated from a semiconductor substrate or a wafer.

The semiconductor die may refer to a semiconductor chip. The semiconductor die may refer to a memory chip in which memory devices such as dynamic random access memory (DRAM) devices, static random access memory (SRAM) devices, NAND-type flash memory devices, NOR-type flash memory devices, magnetic random access memory (MRAM) devices, resistive random access memory (ReRAM) devices, ferroelectric random access memory (FeRAM) devices, or phase change random access memory (PcRAM) devices are integrated. The semiconductor die may refer to logic dies or ASIC chips in which logic circuits are integrated in a semiconductor substrate, or processor such as application processors (Aps), graphic processing units (GPUs), central processing units (CPUs) or system-on-chips (SoCs).

The semiconductor dies may be employed in information communication systems such as mobile phones, electronic systems associated with biotechnology or health care, or wearable electronic systems. The semiconductor packages may be applicable to internet of things (IoT).

Same reference numerals refer to same devices throughout the specification. Even though a reference numeral might not be mentioned or described with reference to a drawing, the reference numeral may be mentioned or described with reference to another drawing. In addition, even though a reference numeral might not be shown in a drawing, it may be shown in another drawing.

Figure 2:
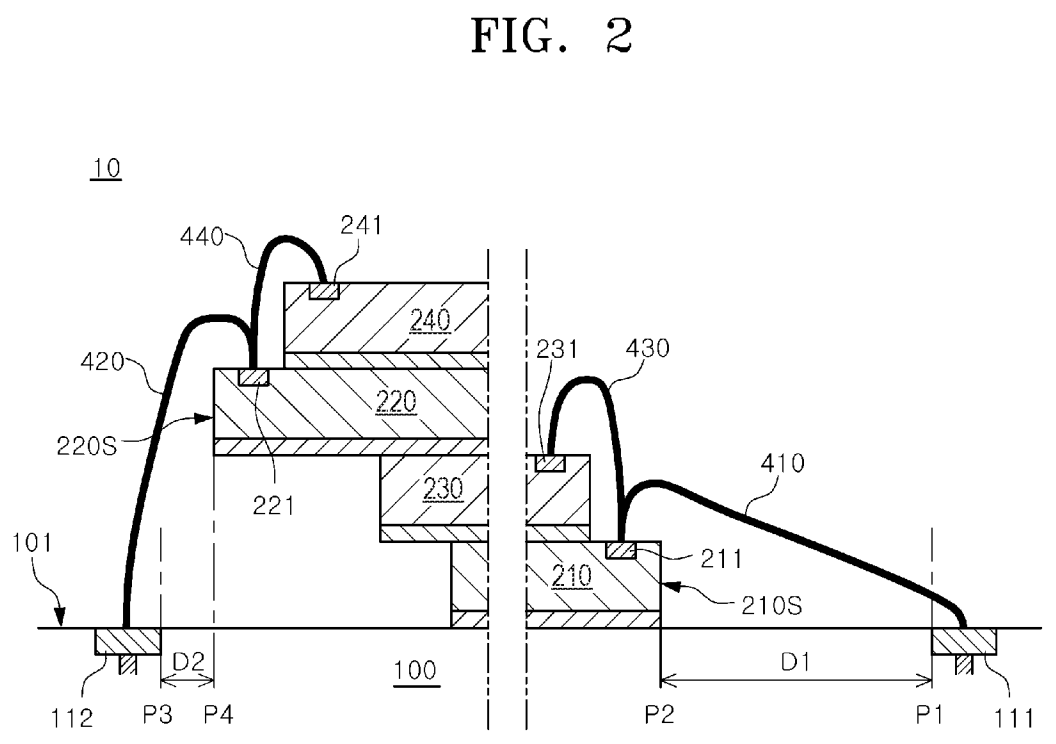

FIG. 1 is a view illustrating a cross-sectional shape of a stack package 10 according to an embodiment of the present disclosure. FIG. 2 is an enlarged view illustrating some portions of the stack package 10 of FIG. 1.

Referring to FIGS. 1 and 2, the stack package 10 may include a package substrate 100, a first semiconductor die 210, a second semiconductor die 220, a first connector 410, and a second connector 420. The stack package 10 may further include a third semiconductor die 230, a fourth semiconductor die 240, a third connector 430, and a fourth connector 440. Although not illustrated, the stack package 10 may further include an encapsulant layer that covers the package substrate 100 and encapsulates the first to fourth semiconductor dies 210, 220, 230, and 240.

The package substrate 100 may be an interconnection component that electrically connects the semiconductor dies 210, 220, 230, and 240 to an external device, an external module, or external electronic components. In an embodiment, the package substrate 100 may be configured in a form of a printed circuit board (PCB). In an embodiment, the package substrate 100 may have a structure including conductive patterns arranged in a dielectric layer. The conductive patterns may include redistribution layers (RDLs), trace patterns, or vias. In an embodiment, the package substrate 100 may have a form of an interposer including circuit wirings or redistribution layers.

The package substrate 100 may include a first bond finger 111 and a second bond finger 112. On a first surface 101 of the package substrate 100, the first bond finger 111 and the second bond finger 112 may be disposed to be spaced apart from each other. Each of the first bond finger 111 and the second bond finger 112 may be a conductive pattern. Each of the first bond finger 111 and the second bond finger 112 may be a portion of a circuit pattern or a trace pattern.

A first outer connector 131 and a second outer connector 132 may be disposed on a second surface 102 opposite to the first surface 101 of the package substrate 100. The first outer connector 131 and the second outer connector 132 may be elements electrically connecting the package substrate 100 to an external device, an external module, or external electronic components. Each of the first outer connector 131 and the second outer connector 132 may be formed in a form of a conductive solder ball or a conductive bump. The package substrate 100 may further include a first internal conductive pattern 121 and a second internal conductive pattern 122. Each of the first internal conductive pattern 121 and the second internal conductive pattern 122 may be formed as a conductive via substantially penetrating the package substrate 100. The first internal conductive pattern 121 may connect the first bond finger 111 to the first outer connector 131, and the second internal conductive pattern 122 may connect the second bond finger 112 to the second outer connector 132.

The first semiconductor die 210 may be disposed over the package substrate 100. The second semiconductor die 220 may be stacked over the first semiconductor die 210. Each of the first and second semiconductor dies 210 and 220 may include a semiconductor substrate on which integrated circuits are integrated. The integrated circuits may include memory devices. The memory devices may be dynamic random access memory (DRAM) devices or NAND flash devices.

The first semiconductor 210 may be disposed over a portion of the package substrate 100 between the first bond finger 111 and the second bond finger 112. The first semiconductor die 210 may be disposed over the first surface 101 of the package substrate 100 so that a first side surface 210S of the first semiconductor die 210 faces the first bond finger 111. The second semiconductor 220 may be stacked over the first semiconductor die 210 so that a portion of the second semiconductor die 220 overlaps with the first semiconductor die 210 in a vertical direction. The second semiconductor 220 may be disposed over the first semiconductor die 210 so that a second side surface 220S of the second semiconductor die 220 substantially faces the second bond finger 112 or faces the side where the second bond finger 112 is located.

The first connector 410 may connect the first semiconductor die 210 to the first bond finger 111. The second connector 420 may connect the second semiconductor die 220 to the second bond finger 112. The second connector 420 may extend to have a length substantially the same as a length of the first connector 410. Because, in an embodiment, the second connector 420 and the first connector 410 have substantially the same length, the time during which signals are transmitted through the second connector 420 and the time during which signals are transmitted through the first connector 410 may be substantially the same. The first connector 410, the first internal conductive pattern 121, and the first outer connector 131 may constitute a first signal transmission channel, and the second connector 420, the second internal conductive pattern 122, and the second outer connector 132 may constitute a second signal transmission channel. Because, in an embodiment, the second connector 420 and the first connector 410 have substantially the same length, a signal transmission time difference between the first signal transmission channel and the second signal transmission channel may be reduced. Accordingly, in an embodiment, it is possible to suppress or reduce the difference in signal transmission characteristics between the first signal transmission channel and the second signal transmission channel. Because, in an embodiment, the difference in the signal transmission characteristics between the first signal transmission channel and the second signal transmission channel may be reduced, it is possible to configure a plurality of signal transmission channels in the stack package 10. Therefore, in an embodiment, the signal transmission bandwidth of the stack package 10 may be extended.

Referring to FIG. 2, the first connector 410 may include a first bonding wire, and the second connector 420 may include a second bonding wire. Because the second semiconductor die 220 is disposed over the first semiconductor die 210, the second semiconductor die 220 may be disposed at the higher position than the first semiconductor die 210. Accordingly, the lengths of the first bonding wire and the second bonding wire may be different according to the position heights of the second semiconductor die 220 and the first semiconductor die 210.

When a first distance D1 in which the first bond finger 111 is spaced apart from the first side surface 210S of the first semiconductor die 210 is the same as a second distance D2 in which the second bond finger 112 is spaced apart from a position P4 where the second side surface 220S of the second semiconductor die 220S overlaps with the first surface 101 of the package substrate 100, the second semiconductor die 220 is located at a higher position than the first semiconductor die 210, so that the second bonding wire may have a longer length than the first bonding wire. In this case, because a time delay of a signal transmitted through the second bonding wire is greater than a time delay of a signal transmitted through the first bonding wire, the signal transmission characteristics may be different for each channel. The first distance D1 may be a separation distance between a position P2 of the first surface 210S of the first semiconductor die 210 and a position P1 of an end of the first bond finger 111, facing the first surface 210S of the first semiconductor die 210. The second distance D2 may be a separation distance between the position P4 where the second side surface 220S of the second semiconductor die

220 overlaps with the first surface 101 of the package substrate 100 and a position P3 of the second bond finger 112, facing the second surface 220S of the second semiconductor die 220.

The first distance D1 in which the first bond finger 111 is spaced apart from the first side surface 210S of the first semiconductor die 210 is greater than the second distance D2 in which the second bond finger 112 is spaced apart from the position P4 where the second surface 220S of the second semiconductor die 220 overlaps with the first surface 101 of the package substrate 100, so that the first connector 410 may be further extended to have substantially the same length as the length of the second connector 420. In an embodiment, a second distance D2 in which the second bond finger 112 is spaced apart from a position where a second side surface 220S of the second semiconductor die 220 adjacent to the second bond finger 112 overlaps with the package substrate 100 is shorter than a first distance D1 in which the first bond finger 111 is spaced apart from a first side surface 210S of the first semiconductor die 210, thereby reducing a length difference between the first connector 410 and the second connector 420. In an embodiment, by making the second distance D2 shorter than the first distance D1, the length difference between the second connector 420 and the first connector 410 may be reduced. Accordingly, in an embodiment, it is possible to suppress or reduce the difference in signal transmission characteristics between the first signal transmission channel and the second signal transmission channel.

Referring back to FIG. 1, the second semiconductor die 220 may be disposed over the first semiconductor die 210 so that a portion 210P of the first semiconductor die 210 protrudes out of the second semiconductor die 220. The second semiconductor die 220 may be disposed over the first semiconductor die 210 so that a portion 220P of the second semiconductor die 220 protrudes out of the first semiconductor die 210. The second semiconductor die 220 may be stacked over the first semiconductor die 210 at a position offset in a first offset direction from the position where the first semiconductor die 210 is disposed. The first offset direction may be a first direction toward the second bond finger 112 from the first bond finger 111. In an embodiment, the second semiconductor die 220 may be disposed over the first semiconductor die 210 so that a portion 210P of the first semiconductor die 210 protrudes out, in the second offset direction, further than a side surface of the second semiconductor die 220 as shown in FIG. 1. In an embodiment, because the first semiconductor die 210 protrudes out, in the second offset direction, further than a side surface of the second semiconductor die 220, the portion 210p might not be overlapped by the second semiconductor die 220 in the vertical direction. In an embodiment, the second semiconductor die 220 may be disposed over the first semiconductor die 210 so that a portion 220P of the second semiconductor die 220 protrudes out, in the first offset direction, further than a side surface of the first semiconductor die 210 as shown in FIG. 1. In an embodiment, because the second semiconductor die 220 protrudes out, in the first offset direction, further than a side surface of the first semiconductor die 210, the portion 220p might not overlap with the first semiconductor die 210 in the vertical direction. In an embodiment, the second connector 420 may have one end directly connected to the second connection pad 221 and the other end directly connected to the second bond finger 112. In an embodiment, the first connector 410 may have one end directly connected to the first connection pad 210P and the other end directly connected to the first bond finger 111.

The first semiconductor die 210 may further include a conductive first connection pad 211. The first connector 410 may be connected or bonded to the first connection pad 211. The first connector 410 may connect the first connection pad 211 to the first bond finger 111. The first connection pad 211 may be disposed on the portion 210P of the first semiconductor die 210, protruding out of the second semiconductor die 220.

The second semiconductor die 220 may further include a conductive second connection pad 221. The second connector 420 may be connected or bonded to the second connection pad 221. The second connector 420 may connect the second connection pad 221 to the second bond finger 112. The second connection pad 221 may be disposed on the portion 220P of the second semiconductor die 220, protruding out of the first semiconductor die 210.

The stack package 10 may further include a third semiconductor die 230 disposed between the first semiconductor die 210 and the second semiconductor die 220. The third semiconductor die 230 may be stacked over the first semiconductor die 210, at a position offset in the first offset direction with respect to the first semiconductor die 210. The second semiconductor die 220 may be stacked over the third semiconductor die 230, at a position offset in the first offset direction with respect to the third semiconductor die 230. The first semiconductor die 210, the third semiconductor die 230, and the second semiconductor die 220 may be stacked while being sequentially offset in the first offset direction.

The stack package 10 may further include the third connector 430 connecting the third semiconductor die 230 and the first semiconductor die 210 to each other. The third connector 430 may be a third bonding wire connecting a third connection pad 231 of the third semiconductor die 230 and the first connection pad 211 of the first semiconductor die 210 to each other. The third connector 430 may be connected to the first connector 410. The third semiconductor die 230 may be electrically and signally connected to the first outer connector 131 through the third connector 430, the first connector 410, the first bond finger 111, and the first internal conductive pattern 121. An additional semiconductor die may be further disposed between the third semiconductor die 230 and the first semiconductor die 210.

The stack package 10 may further include a fourth semiconductor die 240 disposed over the second semiconductor die 220. The fourth semiconductor die 240 may be stacked over the second semiconductor die 220 while being offset with respect to the second semiconductor die 220 in a second offset direction opposite to the first offset direction. The second offset direction may be a second direction toward the first bond finger 111 from the second bond finger 112. An additional semiconductor die may be further disposed between the fourth semiconductor die 240 and the second semiconductor die 220.

The fourth connector 440 may connect the fourth semiconductor die 240 to the second semiconductor die 220. The fourth connector 440 may be a fourth bonding wire connecting a fourth connection pad 241 of the fourth semiconductor die 240 to the second connection pad 221 of the second semiconductor die 220. The fourth connector 440 may be connected to the second connector 420. The fourth semiconductor die 240 may be electrically and signally connected to the second outer connector 132 through the fourth connector 440, the second connector 420, the second bond finger 112, and the second internal conductive pattern 122.

Still referring to FIG. 1, the first semiconductor die 210 may be attached to the first surface 101 of the package substrate 100 by an adhesive layer 300. The semiconductor dies 210, 220, 230, and 240 may be coupled or fixed to each other by the adhesive layers 300. The third semiconductor die 230 may be attached to the first semiconductor die 210 by the adhesive layer 300.

Figure 3:
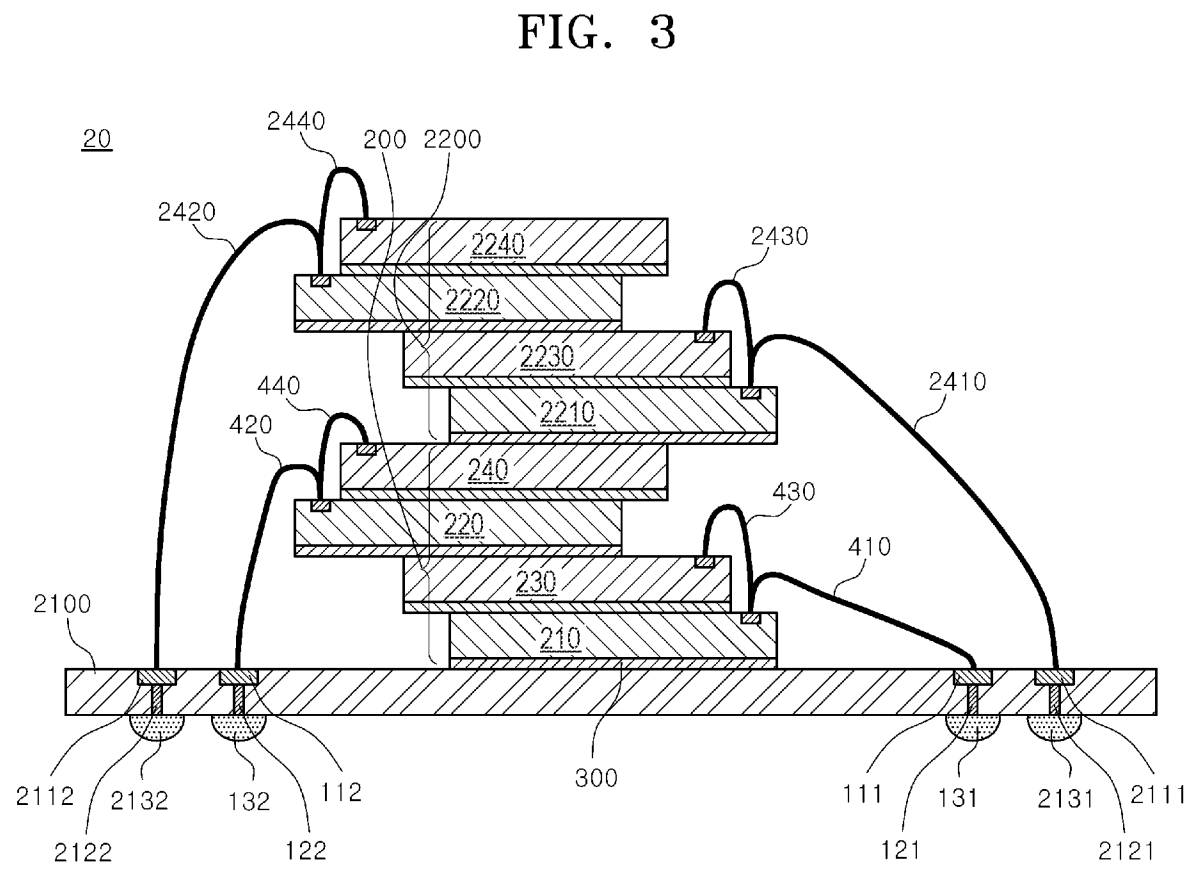

FIG. 3 is a view illustrating a cross-sectional shape of a stack package 20 according to an embodiment of the present disclosure. In FIG. 3, the same reference numerals as in FIGS. 1 and 2 may indicate the same elements.

Referring to FIG. 3, the stack package 20 may include a package substrate 2100, a first stack 200, and a second stack 2200. The first stack 200 may be stacked over the package substrate 2100, and the second stack 2200 may be stacked over the first stack 200. The first stack 200 may include a structure in which a first semiconductor die 210, a third semiconductor die 230, a second semiconductor die 220, and a fourth semiconductor die 240 are stacked while forming a stepped shape, as shown in FIG. 1. The second stack 2200 may include a structure in which a fifth semiconductor die 2210, a seventh semiconductor die 2230, a sixth semiconductor die 2220, and an eighth semiconductor die 2240 are stacked. The second stack 2200 may include substantially the same stack structure as the first stack 200. The fifth semiconductor die 2210 of the second stack 2200 may be disposed to overlap with the first semiconductor die 210 of the first stack 200 substantially completely, over the fourth semiconductor die 240 of the first stack 200.

The package substrate 2100 may include a first bond finger 111 and a second bond finger 112, and may include a first internal conductive pattern 121, a second internal conductive pattern 122, a first outer connector 131, and a second outer connector 132. The package substrate 2100 may further include a third bond finger 2111 and a fourth bond finger 2112, and may include a third internal conductive pattern 2121, a fourth internal conductive pattern 2122, a third outer connector 2131, and a fourth outer connector 2132. The third bond finger 2111 may be positioned farther than the first bond finger 111 from the first semiconductor die 210. The fourth bond finger 2112 may be positioned farther than the second bond finger 112 from the first semiconductor die 210.

The stack package 20 may include a first connector 410, a second connector 420, a third connector 430, and a fourth connector 440 connecting the first stack 200 to the package substrate 2100. The stack package 20 may include a fifth connector 2410, a sixth connector 2420, a seventh connector 2430, and an eighth connector 2440 connecting the second stack 2200 to the package substrate 2100. The fifth connector 2410 may be a fifth bonding wire connecting the fifth semiconductor die 2210 to the third bond finger 2111. The sixth connector 2420 may be a sixth bonding wire connecting the sixth semiconductor die 2220 to the fourth bond finger 2112. The seventh connector 2430 may be a seventh bonding wire connecting the seventh semiconductor die 2230 to the fifth semiconductor die 2210 and the fifth connector 2410. The eighth connector 2440 may be an eighth bonding wire connecting the eighth semiconductor die 2240 to the sixth semiconductor die 2220 and the sixth connector 2420.

Because the third bond finger 2111 is positioned farther than the first bond finger 111 from the first semiconductor die 210, the fifth connector 2410 may have substantially the same length as the sixth connector 2420, or a length difference between the fifth connector 2410 and the sixth connector 2420 may be reduced. Accordingly, in an embodiment, when a signal is transmitted through the fifth connector 2410 and the sixth connector 2420, a change in signal transmission characteristics may be suppressed or reduced.

The various concepts have been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the various concepts are not limited to the above descriptions but defined by the accompanying claims, and all of distinctive features in the equivalent scope should be construed as being included in the various concepts.

What is claimed is:

1. A stack package comprising:
a package substrate comprising a first bond finger and a second bond finger, the first bond finger spaced apart from the second bond finger;
a first semiconductor die disposed over a portion of the package substrate between the first bond finger and the second bond finger;
a second semiconductor die stacked over the first semiconductor die;
a first connector connecting the first semiconductor die to the first bond finger; and
a second connector connecting the second semiconductor die to the second bond finger, the second connector comprising a length substantially the same as a length of the first connector,
wherein a first distance in which the first bond finger is spaced apart from a first side surface of the first semiconductor die is greater than a second distance in which the second bond finger is spaced apart from a position where a second side surface of the second semiconductor die adjacent to the second bond finger overlaps with the package substrate.

2. The stack package of claim 1,
wherein the first connector comprises a first bonding wire, and
wherein the second connector comprises a second bonding wire.

3. The stack package of claim 1,
wherein the second semiconductor die is disposed over the first semiconductor die so that a portion of the first semiconductor die protrudes out of the second semiconductor die.

4. The stack package of claim 3,
wherein the first semiconductor die further comprises a first connection pad disposed on the portion of the first semiconductor die, protruding out of the second semiconductor die, the first connector being connected to the first connection pad.

5. The stack package of claim 1,
wherein the second semiconductor die is disposed over the first semiconductor die so that a portion of the second semiconductor die protrudes out of the first semiconductor die.

6. The stack package of claim 5,
wherein the second semiconductor die further comprises a second connection pad disposed on the portion of the second semiconductor die, protruding out of the first semiconductor die, the second connector being connected to the second connection pad.

7. The stack package of claim 1, further comprising:

a third semiconductor die disposed between the first semiconductor die and the second semiconductor die; and a third connector connecting the third semiconductor die to the first semiconductor die and connected to the first connector.

8. The stack package of claim 7, wherein the first semiconductor die, the third semiconductor die, and the second semiconductor die are stacked over the package substrate while being sequentially offset in a first direction toward the second bond finger and away from the first bond finger.

9. The stack package of claim 7, further comprising:

a fourth semiconductor die disposed over the second semiconductor die; and a fourth connector connecting the fourth semiconductor die to the second semiconductor die and connected to the second connector.

10. The stack package of claim 9, wherein the fourth semiconductor die is stacked over the second semiconductor die while being offset with respect to the second semiconductor die in a second direction toward the first bond finger and away from the second bond finger.

11. The stack package of claim 9, further comprising a fifth semiconductor die substantially completely overlapping with the first semiconductor die.

12. A stack package comprising:

a package substrate comprising a first bond finger and a second bond finger, the first bond finger spaced apart from the second bond finger;

a first semiconductor die disposed over a portion of the package substrate between the first bond finger and the second bond finger;

a second semiconductor die stacked over the first semiconductor die;

a first connector connecting the first semiconductor die to the first bond finger; and a second connector connecting the second semiconductor die to the second bond finger, wherein a second distance in which the second bond finger is spaced apart from a position where a second side surface of the second semiconductor die adjacent to the second bond finger overlaps with the package substrate is shorter than a first distance in which the first bond finger is spaced apart from a first side surface of the first semiconductor die.

13. The stack package of claim 12, wherein the first connector has substantially the same length as the second connector.

14. The stack package of claim 12, further comprising:

a third semiconductor die disposed between the first semiconductor die and the second semiconductor die; and a third connector connecting the third semiconductor die to the first semiconductor die and connected to the first connector.

15. The stack package of claim 14, wherein the first semiconductor die, the third semiconductor die, and the second semiconductor die are stacked over the package substrate while being sequentially offset in a first direction toward the second bond finger and away from the first bond finger.

16. The stack package of claim 12, further comprising:

a fourth semiconductor die disposed over the second semiconductor die; and a fourth connector connecting the fourth semiconductor die to the second semiconductor die and connected to the second connector.

17. The stack package of claim 16, wherein the fourth semiconductor die is stacked over the second semiconductor die while being offset with respect to the second semiconductor die in a second direction toward the first bond finger and away from the second bond finger.

18. The stack package of claim 17, further comprising a fifth semiconductor die substantially completely overlapping with the first semiconductor die.

* * * * *